US011657752B2

(12) United States Patent
Wang et al.

(10) Patent No.: US 11,657,752 B2
(45) Date of Patent: May 23, 2023

(54) DRIVE CIRCUIT AND DRIVE METHOD, SHIFT REGISTER AND DISPLAY DEVICE

(71) Applicant: WUHAN TIANMA MICROELECTRONICS CO., LTD., Wuhan (CN)

(72) Inventors: Yajun Wang, Wuhan (CN); Jianming Sun, Wuhan (CN)

(73) Assignee: WUHAN TIANMA MICROELECTRONICS CO., LTD., Wuhan (CN)

( * ) Notice: Subject to any disclaimer, the term of this patent is extended or adjusted under 35 U.S.C. 154(b) by 0 days.

(21) Appl. No.: 17/559,253

(22) Filed: Dec. 22, 2021

(65) Prior Publication Data

US 2022/0114945 A1  Apr. 14, 2022

(30) Foreign Application Priority Data

Jun. 30, 2021 (CN) .......................... 202110739075.1

(51) Int. Cl.
*G09G 3/3266* (2016.01)
*G09G 3/20* (2006.01)
*G11C 19/28* (2006.01)

(52) U.S. Cl.
CPC ......... *G09G 3/2092* (2013.01); *G09G 3/3266* (2013.01); *G09G 2310/0286* (2013.01); *G09G 2310/08* (2013.01); *G09G 2330/04* (2013.01); *G11C 19/28* (2013.01)

(58) Field of Classification Search
CPC ............... G09G 3/2092; G09G 3/3266; G09G 2310/0286; G09G 2310/08; G09G 2330/04; G09G 2300/0861; G09G 2330/026; G09G 3/20; G11C 19/28
See application file for complete search history.

(56) References Cited

U.S. PATENT DOCUMENTS

| 10,056,041 B1* | 8/2018 | Ma ....................... G09G 3/3266 |
| 2017/0154602 A1* | 6/2017 | Sun .......................... G09G 3/20 |
| 2018/0233209 A1* | 8/2018 | Ma ....................... H01L 27/1214 |
| 2019/0066597 A1* | 2/2019 | Lan ....................... G09G 3/3266 |
| 2019/0180834 A1* | 6/2019 | Yuan .................... G09G 3/3677 |

(Continued)

FOREIGN PATENT DOCUMENTS

| CN | 110264971 A | 9/2019 |
| CN | 111754915 A | 10/2020 |

*Primary Examiner* — Jose R Soto Lopez
(74) *Attorney, Agent, or Firm* — Christensen O'Connor Johnson Kindness PLLC

(57) ABSTRACT

A drive circuit, a drive method, a shift register, and a display device are provided. The drive circuit includes a control module, an output module, and a protect module. The control module is electrically connected to a start signal line, first and second clock signal lines, first and second potential signal lines, and first and second nodes, and is configured to transmit a voltage signal to the first and the second nodes in response to first and second clock signals. The output module is electrically connected to the first and second potential signal lines, an output wire, and the first and second nodes. The protect module is configured to transmit an effective voltage signal to the first node in response to a control signal in a first state of the drive circuit such that the output module transmits an ineffective voltage signal to the output wire.

21 Claims, 17 Drawing Sheets

(56) References Cited

U.S. PATENT DOCUMENTS

| | | | | |
|---|---|---|---|---|
| 2020/0013473 | A1* | 1/2020 | Xuan | G09G 3/20 |
| 2020/0020291 | A1* | 1/2020 | Huang | G09G 3/3266 |
| 2022/0246101 | A1* | 8/2022 | Long | G09G 3/3225 |
| 2022/0319374 | A1* | 10/2022 | Xu | G09G 3/20 |
| 2022/0319434 | A1* | 10/2022 | Yu | G09G 3/3266 |
| 2022/0343828 | A1* | 10/2022 | Huang | G09G 3/2092 |
| 2022/0375395 | A1* | 11/2022 | Zhao | G09G 3/3233 |
| 2022/0383822 | A1* | 12/2022 | Shang | G11C 19/28 |

\* cited by examiner

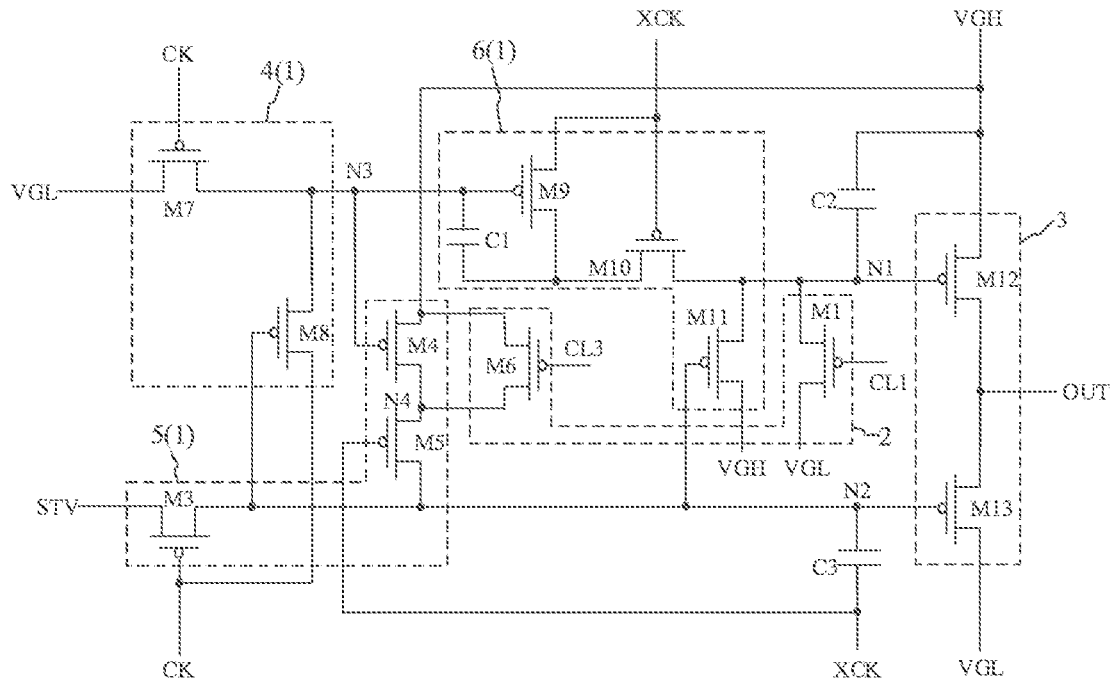

FIG. 14

K1 — In a first state, transmitting, by a protect module, an effective voltage signal to a first node in response to a control signal, and transmitting, by an output module, an ineffective voltage signal to an output wire in response to an effective voltage signal of the first node K2 — In a display state, transmitting, by a control module, voltage signals to the first node and a second node in response to a first clock signal and a second clock signal, and transmitting, by the output module, an effective voltage signal to the output wire in response to a control signal of the first node and a control signal of the second node.

FIG. 15

K1 — In a first state, a protect module transmits an effective voltage signal to a first node in response to a control signal, the protect module also transmits an ineffective voltage signal to a second node in response to the control signal, and an output module transmits the ineffective voltage signal to an output wire in response to the effective voltage signal of the first node K2 — In a display state, a control module transmits a voltage signal to the first node and the second node in response to a first clock signal and a second clock signal, and the output module transmits the effective voltage signal to the output wire in response to control signals of the first node and the second node

FIG. 16

K1 — In a first state, a protect module transmits an effective voltage signal to a first node in response to a control signal, and an output module transmits an ineffective voltage signal to an output wire in response to an effective voltage signal of the first node K2 — In a display state, a control module transmits voltage signals to the first node and a second node in response to a first clock signal and a second clock signal, the output module transmits the effective voltage signal to the output wire in response to the control signals of the first node and the second node, and the protect module stops transmitting the voltage signal to the first node in response to a control signal

FIG. 17

H1 — In a first period, a second control unit transmits an ineffective voltage signal provided by an start signal line to a second node in response to an effective voltage signal provided by a first clock signal line, and a first control unit transmits the effective voltage signal provided by a first potential signal line to a third node in response to the effective voltage signal provided by the first clock signal line H2 — In a second period, the second control unit transmits the ineffective voltage signal to the second node in response to the effective voltage signal of the third node and the effective voltage signal provided by a second clock signal line, a third control unit transmits the effective voltage signal provided by the second clock signal line to a first node in response to the effective voltage signal of the third node and the effective voltage signal provided by the second clock signal line, and an output module transmits the ineffective voltage signal provided by a second potential signal line to an output wire in response to the effective voltage signal of the first node and the ineffective voltage signal of the second node H3 — In a third period, the second control unit transmits the ineffective voltage signal provided by the start signal line to the second node in response to the effective voltage provided by the first clock signal line, the first control unit transmits the effective voltage signal provided by the first potential signal line to the third node in response to the effective voltage signal provided by the first clock signal line, and the output module continues outputting the ineffective voltage signal to the output wire in response to the effective voltage signal of the first node and the ineffective voltage signal of the second node H4 — In a fourth period, the second control unit transmits the ineffective voltage signal to the second node in response to the effective voltage signal of the third node and the effective voltage signal provided by the second clock signal line, the third control unit transmits the effective voltage signal provided by the second clock signal line to the first node in response to the effective voltage signal of the third node and the effective voltage signal provided by the second clock signal line, and the output module continues outputting the ineffective voltage signal to the output wire in response to the effective voltage signal of the first node and the ineffective voltage signal of the second node H5 — In a fifth period, the second control unit transmits the effective voltage signal provided by the start signal line to the second node in response to the effective voltage signal provided by the first clock signal line, the first control unit transmits the effective voltage signal provided by the first clock signal line and the effective voltage signal provided by the first potential signal line to the third node in response to the effective voltage signal provided by the first clock signal line and the effective voltage signal of the second node, the third control unit transmits the ineffective voltage signal provided by the second potential line to the first node in response to the effective voltage signal of the second node, and the output module transmits the effective voltage signal provided by the first potential signal line to the output wire in response to the effective voltage signal of the second node and the ineffective voltage signal of the first node

FIG. 18

K1 — In a first state, a protect module transmits an effective voltage signal to a first node in response to a control signal, a sixth transistor in the protect module transmits an ineffective voltage signal to a fourth node in response to the control signal, a fifth transistor transmits the ineffective voltage signal of the fourth node to a second node in response to a second clock signal, and an output module transmits the ineffective voltage signal to an output wire in response to the effective voltage signal of the first node K2 — In a display state, the control module transmits voltage signals to the first node and the second node in response to a first clock signal and the second clock signal, and the output module transmits the effective voltage signal to the output wire in response to control signals of the first node and the second node

FIG. 19

DRIVE CIRCUIT AND DRIVE METHOD, SHIFT REGISTER AND DISPLAY DEVICE

CROSS-REFERENCE TO RELATED APPLICATIONS

The present application claims priority to Chinese Patent Application No. 202110739075.1, filed on Jun. 30, 2021, the content of which is incorporated herein by reference in its entirety.

TECHNICAL FIELD

The present disclosure relates to the field of display technology, in particular to a drive circuit, a drive method, a shift register, and a display device.

BACKGROUND

The display device includes a display panel, and the display panel includes a plurality of pixels. Each pixel includes a display element (such as the organic light-emitting diodes in the OLED display panel, the liquid crystal display dot in the LCD display panel, and the electrophoretic display dot in the electronic paper display panel) and a pixel circuit that is electrically connected to the display element. The pixel circuit drives the display element to emit light in response to a drive signal (such as a scan drive signal and a light-emitting drive signal).

In the related art, when the display device is powered on for starting up, the drive signal cannot reach an ineffective voltage level immediately, causing turning on of the transistor in the pixel circuit, which in turn causes the pixel circuit to drive the display element to emit light, and thus causes the flickering of the display device during starting up, affecting the display effect.

SUMMARY

In one aspect, an embodiment of the present disclosure provides a drive circuit, and the drive circuit includes a control module, an output module, and a protect module, and has a first state and a display state. The control module is electrically connected to a start signal line, a first clock signal line, a second clock signal line, a first potential signal line, a second potential signal line, a first node, and a second node. The first state is prior to the display state, and the control module is configured to transmit a voltage signal to the first node and the second node in response to a first clock signal and a second clock signal. An output module is electrically connected to the first potential signal line, the second potential signal line, an output wire, the first node, and the second node. The output module is configured to transmit a voltage signal to the output wire in response to a control signal of the first node and a control signal of the second node. In the first state, the protect module is configured to transmit an effective voltage signal to the first node in response to a control signal in such a manner that the output module transmits an ineffective voltage signal to the output wire.

In another aspect, an embodiment of the present disclosure provides a drive method for a drive circuit described above. The drive method includes:

in a first state of the drive circuit, transmitting, by a protect module, an effective voltage signal to a first node in response to a control signal, and transmitting, by an output module, an ineffective voltage signal to an output wire in response to an effective voltage signal of the first node; and in a display state of the drive circuit, transmitting, by a control module, a voltage signal to the first node and a voltage to a second node in response to a first clock signal and a second clock signal, and transmitting, by the output module, an effective voltage signal to the output wire in response to a control signal of the first node and a control signal of the second node, where the drive circuit includes:

the control module electrically connected to a start signal line, a first clock signal line, a second clock signal line, a first potential signal line, a second potential signal line, the first node, and the second node, wherein the drive circuit has the first state and the display state; the output module electrically connected to the first potential signal line, the second potential signal line, the output wire, the first node, and the second node; and the protect module.

In yet another aspect, an embodiment of the present disclosure provides a shift register including drive circuits that are cascaded. Each of the drive circuits includes:

a control module electrically connected to a start signal line, a first clock signal line, a second clock signal line, a first potential signal line, a second potential signal line, a first node, and a second node, where the drive circuit has a first state and a display state, the first state is prior to the display state, and the control module is configured to transmit a voltage signal to the first node and the second node in response to a first clock signal and a second clock signal;

an output module electrically connected to the first potential signal line, the second potential signal line, an output wire, the first node, and the second node, where the output module is configured to transmit a voltage signal to the output wire in response to a control signal of the first node and a control signal of the second node; and a protect module, wherein in the first state, the protect module is configured to transmit an effective voltage signal to the first node in response to a control signal in such a manner that the output module transmits an ineffective voltage signal to the output wire.

In yet another aspect, an embodiment of the present disclosure provides a display device including the shift register provided in above aspect.

BRIEF DESCRIPTION OF DRAWINGS

In order to more clearly illustrate technical solutions of embodiments of the present disclosure, the accompanying drawings used in the embodiments are briefly described below. The drawings described below are merely a part of the embodiments of the present disclosure. For those skilled in the art, other drawings can also be obtained based on these drawings.

FIG. 14 is yet another schematic diagram of the drive circuit according to an embodiment of the present disclosure;

FIG. 15 is a flowchart of a drive method according to an embodiment of the present disclosure;

FIG. 16 is another flowchart of the drive method according to an embodiment of the present disclosure;

FIG. 17 is yet another flowchart of the drive method according to an embodiment of the present disclosure;

FIG. 18 is yet another flowchart of the drive method according to an embodiment of the present disclosure;

FIG. 19 is yet another flowchart of the drive method according to an embodiment of the present disclosure.

DESCRIPTION OF EMBODIMENTS

In order to better understand technical solutions of the present disclosure, the embodiments of the present disclosure are described in detail with reference to the drawings.

It should be clear that the described embodiments are merely a part of the embodiments of the present disclosure rather than all of the embodiments. Various modifications and changes can be made to the present disclosure without departing from the scope of the disclosure, which are obvious to those skilled in the art. Therefore, the present disclosure covers the modifications and changes of the present disclosure that fall within the scope of the corresponding claims (claimed technical solutions) and their equivalents. It should be noted that the embodiments in the present disclosure can be combined mutually in the case of no conflict.

The terms used in the embodiments of the present disclosure are merely for the purpose of describing specific embodiments, rather than limiting the present disclosure. The singular form "a", "an", "the" and "said" used in the embodiments and claims shall be interpreted as also including the plural form, unless indicated otherwise in the context.

It should be understood that the term "and/or" used herein is merely an association relationship describing associated objects, indicating that there can be three relationships, for example, A and/or B can indicate that three cases, i.e., A alone, A and B, B alone. In addition, the character "/" herein generally indicates that the related objects before and after the character form an "or" relationship.

It should be also understood that the terms "first", "second", and the like used to describe control units in the embodiments of the present disclosure are not intended to limit these control units. These terms are merely used to distinguish control units from one another. For example, without departing from the scope of the embodiments of the present disclosure, a first control unit can also be referred to as a second control unit. Similarly, a control unit can also be referred to as a first control unit.

Before describing the technical solutions provided by the embodiments of the present disclosure, the present disclosure first describes in detail the problems in the related technologies.

As described in the background, the drive signal cannot reach an ineffective voltage level immediately when the display device is powered on for starting up, and thus the pixel circuit drives the display element to emit light under the effective voltage level of the drive signal.

Figure 1:
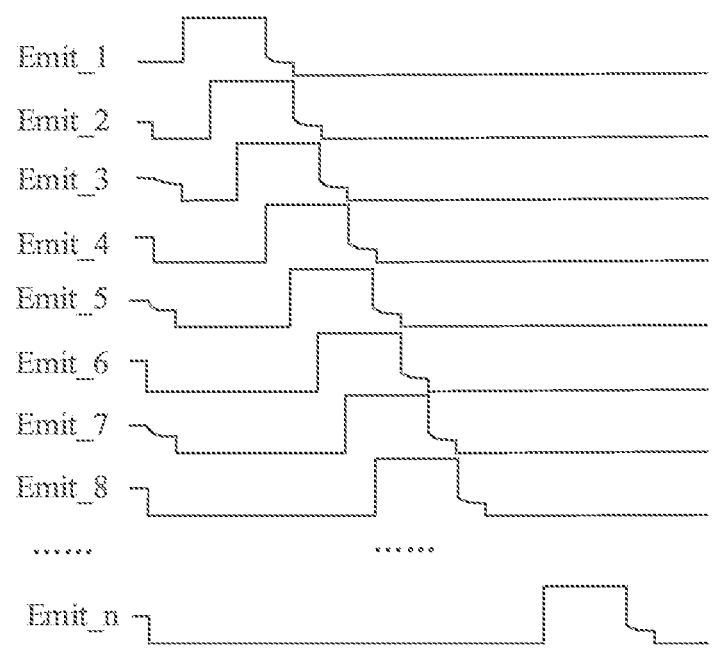
FIG. 1 is a timing diagram of a light-emitting drive signal in the related art.

For example, the drive signal is the light-emitting drive signal in the OLED panel, a low voltage level is the effective voltage level of the light-emitting drive signal. When the pixel circuit receives the light-emitting drive signal at the low voltage level, the pixel circuit transmits the drive signal to the display element, thereby driving the display element to emit light. FIG. 1 is a timing diagram of a light-emitting drive signal in the related art. As shown in FIG. 1, "Emit_i" denotes the light-emitting drive signal corresponding to the ith row of pixel circuit, i=1, 2, . . . , n, where n is the number of rows of the pixel circuits. When the display device is powered on for starting up, the voltage of the light-emitting drive signal Emit changes, the light-emitting drive signal Emit firstly changes to the low voltage level and maintains at the low voltage level for a period, and then changes to the high voltage level. Then, the display device enters the normal display of the first frame image. During this period when the light-emitting drive signal Emit is at the low voltage level, the pixel circuit transmits the drive signal (such as drive current) to the display element (such as the organic light-emitting diode), resulting in, for example, the starting up flickering of the display device before the display of the first frame image.

Figure 2:
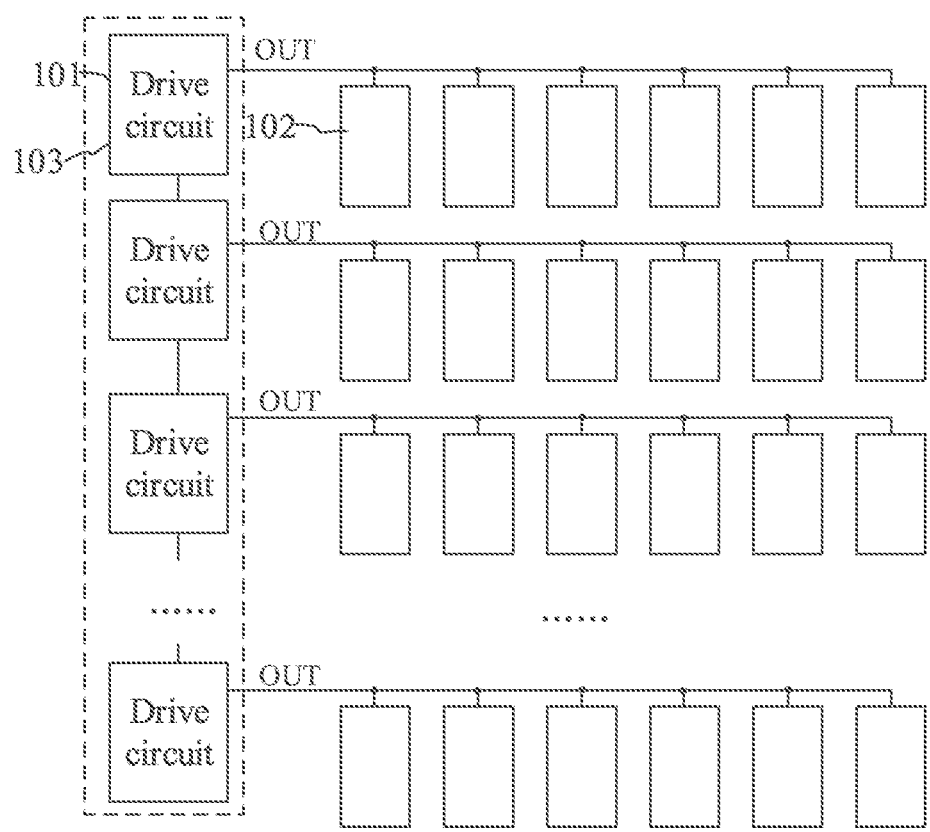
FIG. 2 is a schematic diagram of connection of a drive circuit and a pixel circuit according to an embodiment of the present disclosure.

In order to solve the above problem, an embodiment of the present disclosure provides a drive circuit. For example, the drive circuit is the drive circuit in a display panel (such as the OLED display panel, the LCD display panel, or the electronic paper display panel). FIG. 2 is a schematic diagram showing connection of a drive circuit and a pixel circuit according to an embodiment of the present disclosure. As shown in FIG. 2, the drive circuit 101 is electrically connected to a pixel circuit 102, and the drive circuit 101 is configured to transmit a drive signal to the pixel circuit 102 to control the pixel circuit 102 to operate.

Figure 3:
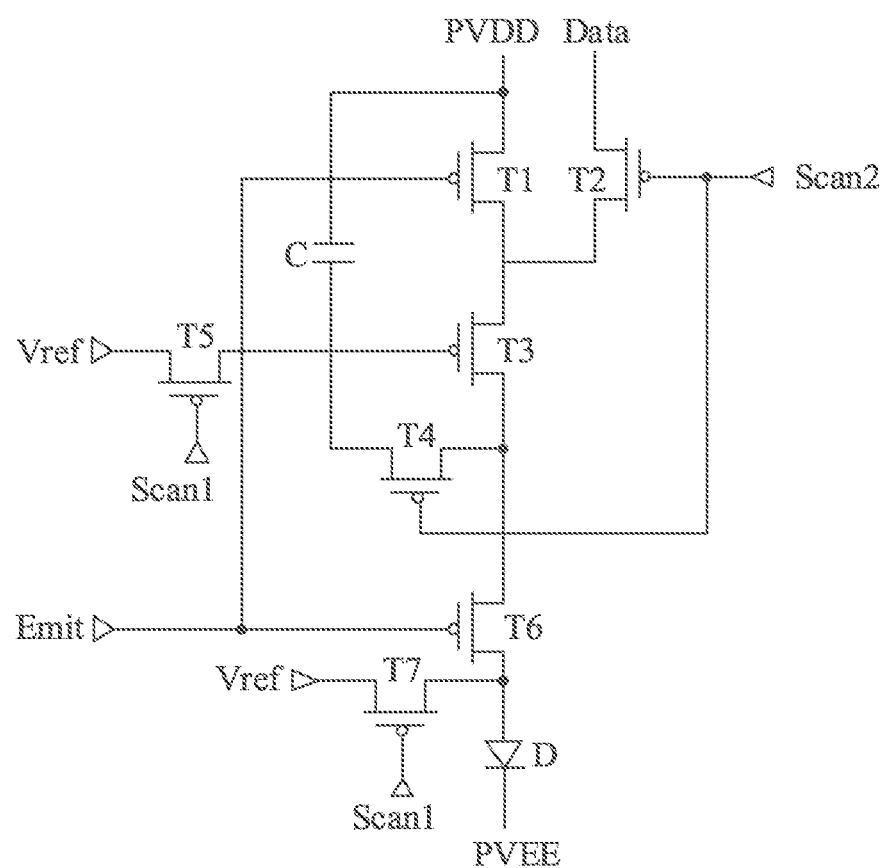
FIG. 3 is a schematic diagram of a pixel circuit according to an embodiment of the present disclosure.
Figure 4:
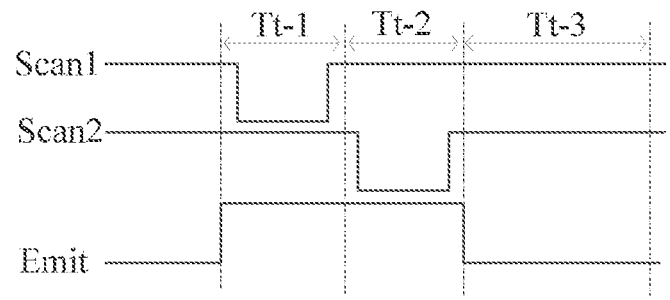
FIG. 4 is a timing diagram corresponding to FIG. 3.

The pixel circuit 102 in the OLED display panel shown in FIG. 3 is taken as an example with reference to the signal timing diagram shown in FIG. 4. The pixel circuit 102 includes a capacitor C and a first switch transistor T1 to a seventh switch transistor T7.

In an initialization period Tt-1, a first scan drive signal provided by a first scan line Scan1 is at a low voltage level, and a second scan drive signal provided by a second scan line Scan2 and a light-emitting drive signal provided by a light-emitting control signal line Emit are both at a high voltage level. A reference voltage signal provided by a reference voltage line Vref resets a voltage of a control electrode of the third switch transistor T3 through the turned-on fifth switch transistor T5, and resets, through the turned-on seventh switch transistor T7, the display element, for example, an anode of an organic light-emitting element D.

In a charging period Tt-2, the second scan drive signal provided by the second scan line Scan2 is at the low voltage level, the first scan drive signal provided by the first scan line Scan1 and the light-emitting drive signal provided by the light-emitting control signal line Emit are both at the high voltage level, a data signal is written to the control electrode of the third switch transistor T3 through the turned-on second switch transistor T2 and the turned-on fourth switch transistor T4.

In a light-emitting control period Tt-3, the light-emitting drive signal provided by the light-emitting control signal line Emit is at the low voltage level, the first scan drive signal provided by the first scan line Scan1 and the second scan drive signal provided by the second scan line Scan2 are both at the high voltage level, the first switch transistor T1 and the sixth switch transistor T6 are turned on, and the organic light-emitting element D emits light under the drive current that is converted from the data signal and a power supply signal provided by a power supply signal line PVDD.

Exemplarily, the drive signal transmitted by the drive circuit 101 to the pixel circuit 102 is the light-emitting drive signal.

Figure 5:
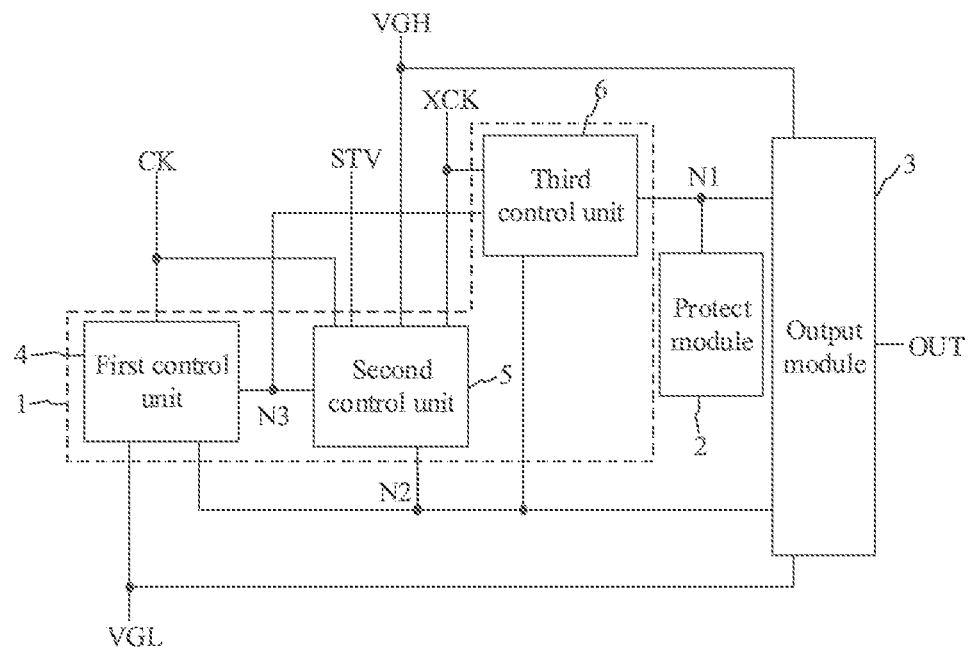
FIG. 5 is a schematic diagram of a drive circuit according to an embodiment of the present disclosure.

FIG. 5 is a schematic diagram of a drive circuit according to an embodiment of the present disclosure. As shown in FIG. 5, the drive circuit includes a control module 1, a protect module 2, and an output module 3. The drive circuit has a first state and a display state, and the first state is prior to the display state.

The control module 1 is electrically connected to a start signal line STV, a first clock signal line CK, a second clock signal line XCK, a first potential signal line VGL, a second potential signal line VGH, a first node N1, and a second node N2. The control module 1 is configured to transmit a voltage signal to the first node N1 and the second node N2 in response to a first clock signal and a second clock signal.

The output module 3 is electrically connected to the first potential signal line VGL, the second potential signal line VGH, an output wire OUT, the first node N1, and the second node N2. The output module 3 is configured to transmit a voltage signal to the output wire OUT in response to a control signal of the first node N1 and a control signal of the second node N2, and the voltage signal is the drive signal described above, and the output wire OUT further transmits the voltage signal to the pixel circuit.

In the first state, the protect module 2 is configured to transmit an effective voltage signal to the first node N1 in response to a control signal such that the output module 3 transmits an ineffective voltage signal to the output wire OUT.

It should be noted that the display state described above refers to a state in which the output module 3 transmits an effective voltage signal to the output wire OUT, such that the pixel circuit drives the display element to emit light. For example, the drive circuit is an emission drive circuit in the OLED display panel and the drive signal is the light-emitting drive signal, when the drive circuit transmits an effective voltage signal (such as the low voltage level) to the output wire OUT (the light-emitting control signal line Emit), the output wire OUT further transmits the effective voltage signal to the pixel circuit, and the pixel circuit outputs a drive signal to the display element under the effective voltage signal to drive the display element to emit light, and this state is the display state.

The first state is prior to the display state, and the first state can include a state in which the display device is powered on for starting up and does not start to display images, and a state in which the drive circuit transmits the ineffective voltage signal to the output wire OUT when entering displaying of each frame image.

In embodiments of the present disclosure, the drive circuit includes the protect module 2, before the display device is powered on for starting up and before the display of the first frame image, the drive circuit is in the first state. In the first state, the protect module 2 transmits an effective voltage signal to the first node N1 in response to the control signal such that the output module 3 transmits the ineffective voltage signal to the output wire OUT in response to the effective voltage signal of the first node N1. The ineffective voltage signal is further transmitted to the pixel circuit through the output wire OUT such that the pixel circuit cannot transmit the drive signal (drive current) to the display element (organic light-emitting diode), thereby ensuring that the organic light-emitting diode does not emit light in this state. For example, the drive circuit is the emission drive circuit, combined with the timing diagram of the drive signal shown in FIG. 6, in the first state, the output module 3 transmits the ineffective voltage signal (high voltage level) to the output wire OUT, thereby ensuring that the pixel circuit cannot drive the organic light-emitting diode to emit light.

It can be seen from the above, the drive circuit provided by the embodiment of the present disclosure can effectively avoid the flickering of the display device during starting up and improve the working reliability and display effect of the display device.

Figure 7:
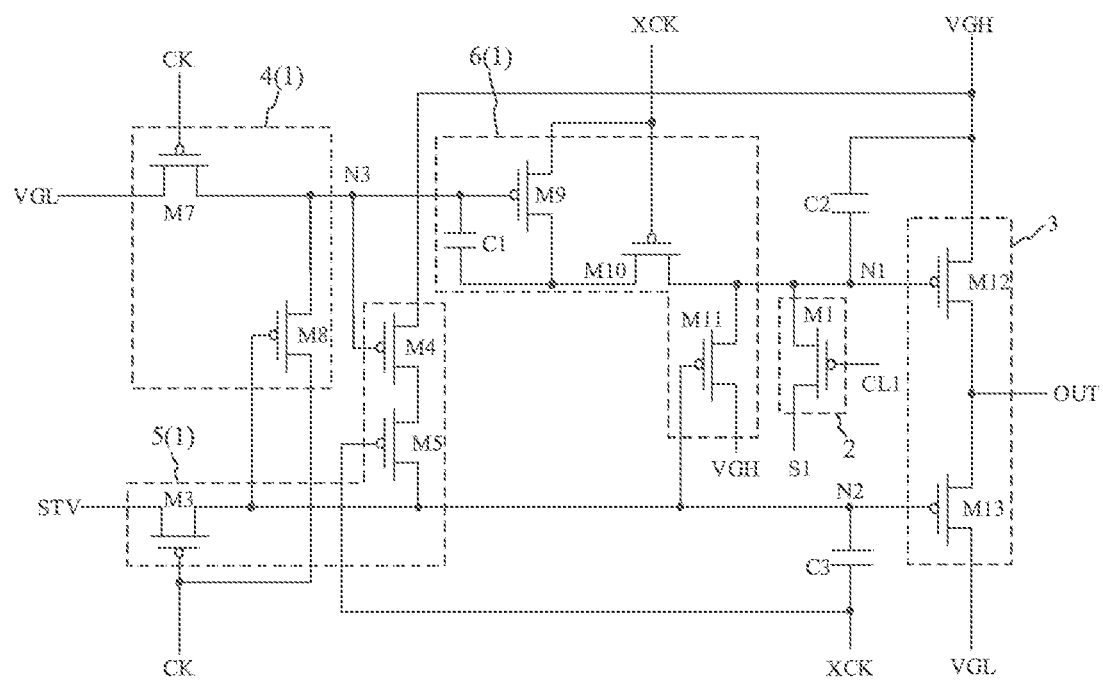
FIG. 7 is another schematic diagram of the drive circuit according to an embodiment of the present disclosure.

FIG. 7 is another schematic diagram of the drive circuit according to an embodiment of the present disclosure. In an embodiment, as shown in FIG. 7, the protect module 2 includes a first transistor M1. A control electrode of the first transistor M1 is electrically connected to a first control signal line CL1, a first electrode of the first transistor M1 is electrically connected to a first signal line S1, and a second electrode of the first transistor M1 is electrically connected to the first node N1.

In the first state, the first transistor M1 is turned on under a first control signal provided by the first control signal line CL1, and the effective voltage signal provided by the first signal line S1 is transmitted to the first node N1 through the turned-on first transistor M1. At this time, the output module 3 transmits the ineffective voltage signal to the output wire OUT in response to the effective voltage signal of the first node N1, and the output wire OUT further transmits the ineffective voltage signal to the pixel circuit, and thus the pixel circuit cannot transmits the drive signal to the display element, and the display element does not emit light in the first state, avoiding the starting up flickering.

In an embodiment, the protect module 2 further transmits the ineffective voltage signal to the second node N2 in response to a control signal in the first state. At this time, the output module 3 does not transmit the effective voltage signal to the output wire OUT, and the accuracy of the voltage level state of the signal outputted by the output module 3 in the first state is improved.

Figure 8:
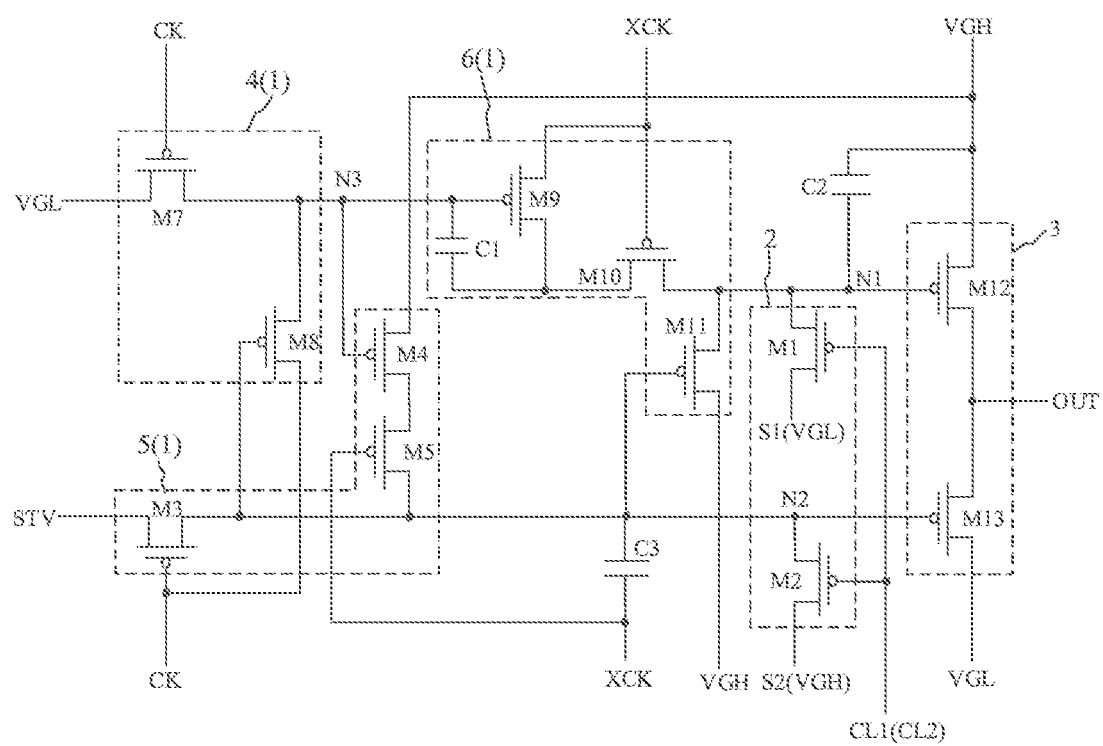
FIG. 8 is yet another schematic diagram of the drive circuit according to an embodiment of the present disclosure.

FIG. 8 is yet another schematic diagram of the drive circuit according to an embodiment of the present disclosure. In an embodiment, as shown in FIG. 8, the protect module 2 includes a second transistor M2. A control electrode of the second transistor M2 is electrically connected to the second control signal line CL2, a first electrode of the second transistor M2 is electrically connected to the second signal line S2, and a second electrode of the second transistor M2 is electrically connected to the second node N2.

In the first state, the second transistor M2 is turned on under a second control signal provided by the second control signal line CL2, the ineffective voltage signal provided by the second signal line S2 is transmitted to the second node N2 through the turned-on second transistor M2, such that the output module 3 does not transmit the effective voltage signal to the output wire OUT.

In an embodiment, referring to FIG. 8 again, when the first transistor M1 and the second transistor M2 are of a same type, the first control signal line CL1 and the second control signal line CL2 can be reused as a same control signal line. In another embodiment of the present disclosure, when the first transistor M1 and the second transistor M2 are of different types, the first control signal line CL1 and the second control signal line CL2 can be two separated control signal lines.

In an embodiment, referring to FIG. 8 again, the control electrode of the first transistor M1 is electrically connected to the control electrode of the second transistor M2. At this time, the first control signal line CL1 and the second control signal line CL2 can be reused as a same control signal line to save the layout space.

Based on the above, referring to FIG. 8 again, the first signal line S1 is the first potential signal line VGL, and the second signal line S2 is the second potential signal line VGH.

With such configuration, in the first state, the first transistor M1 and the second transistor M2 are turned on under the first control signal, and the effective voltage signal (low voltage level) provided by the first potential signal line VGL is transmitted to the first node N1 through the turned-on first transistor M1, and the ineffective voltage signal (high voltage level) provided by the second potential signal line VGH is transmitted to the second node N2 through the turned-on second transistor M2.

Figure 9:
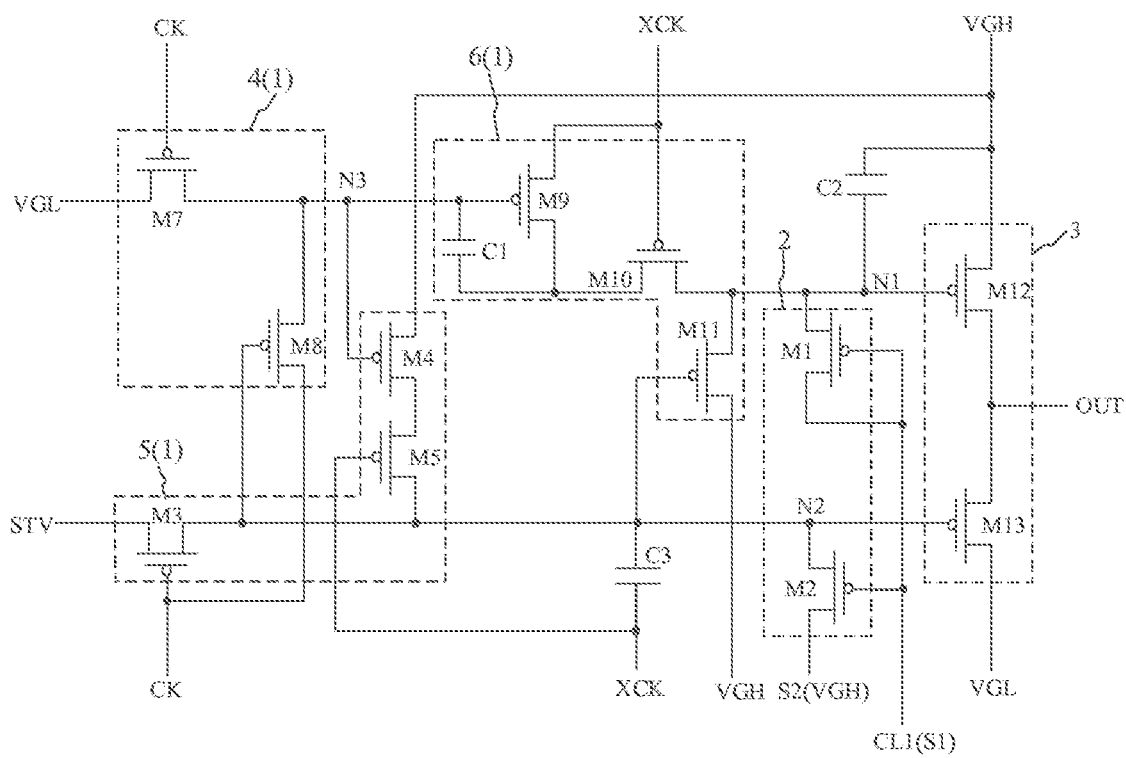
FIG. 9 is yet another schematic diagram of the drive circuit according to an embodiment of the present disclosure.

FIG. 9 is yet another schematic diagram of the drive circuit according to an embodiment of the present disclosure. In another embodiment, as shown in FIG. 9, the first transistor M1 and the second transistor M2 each are a P-type transistor, the first electrode of the first transistor M1 is electrically connected to the control electrode of the first transistor M1, and the second signal line S2 is the second potential signal line VGH.

With such configuration, in the first state, the first transistor M1 and the second transistor M2 which are P type are turned on under the low voltage level provided by the first control signal line CL1, the low voltage level provided by the first control signal line CL1 is transmitted to the first node N1 through the turned-on first transistor M1, and the high voltage level provided by the second potential signal line VGH is transmitted to the second node N2 through the turned-on second transistor M2.

In the layout design of this structure, the first electrode of the first transistor M1 can be directly connected to the control electrode thereof, and the first electrode of the first transistor M1 does not need to be connected to other signal lines through connecting wires, saving layout space.

Figure 10:
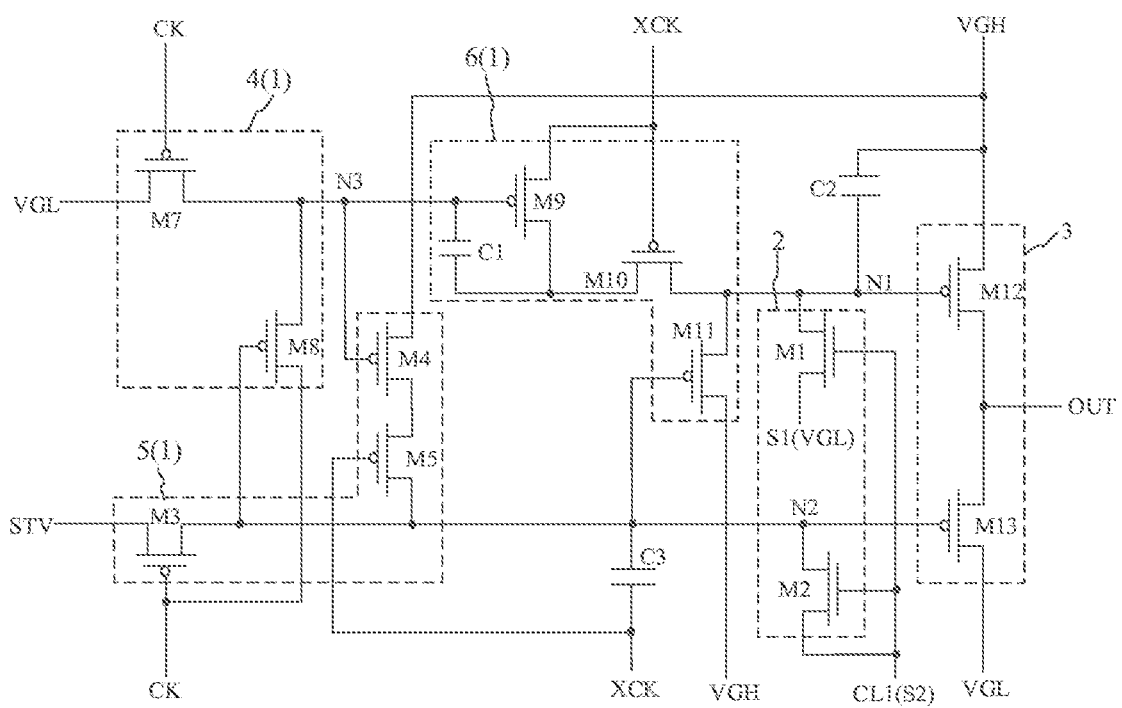
FIG. 10 is yet another schematic diagram of the drive circuit according to an embodiment of the present disclosure.

FIG. 10 is yet another schematic diagram of the drive circuit according to an embodiment of the present disclosure. In yet another embodiment, as shown in FIG. 10, the first transistor M1 and the second transistor M2 are both N-type, the first electrode of the second transistor M2 is electrically connected to the control electrode of the second transistor M2, and the first signal line S1 is the first potential signal line VGL.

With such configuration, in the first state, the first transistor M1 and the second transistor M2 which are N type are turned on under the high voltage level provided by the first control signal line CL1, the low voltage level provided by the first potential signal line VGL is transmitted to the first node N1 through the turned-on first transistor M1, and the high voltage level provided by the first control signal line CL1 is transmitted to the second node N2 through the turned-on second transistor M2.

In the layout design of this structure, the first electrode of the second transistor M2 can be directly connected to the control electrode thereof, and the first electrode of the second transistor M2 does not need to be connected to other signal lines through connecting wires, saving layout space.

In an embodiment, referring to FIG. 5 again, the control module 1 can include a first control unit 4, a second control unit 5, and a third control unit 6.

The first control unit 4 is electrically connected to the first clock signal line CK, the first potential signal line VGL, the second node N2, and a third node N3, and is configured to transmit a voltage signal to the third node N3 in response to the first clock signal and the voltage signal of the second node N2. The second control unit 5 is electrically connected to the start signal line STV, the first clock signal line CK, the second clock signal line XCK, the second potential signal line VGH, the third node N3, and the second node N2, and is configured to transmit a voltage signal to the second node N2 in response to the first clock signal, the second clock signal, and the voltage signal of the third node N3. The third control unit 6 is electrically connected to the second clock signal line XCK, the first node N1, the second node N2, and the third node N3, and is configured to transmit a voltage signal to the first node N1 in response to a voltage signal of the third node N3, the second clock signal, and the voltage signal of the second node N2.

Figure 11:
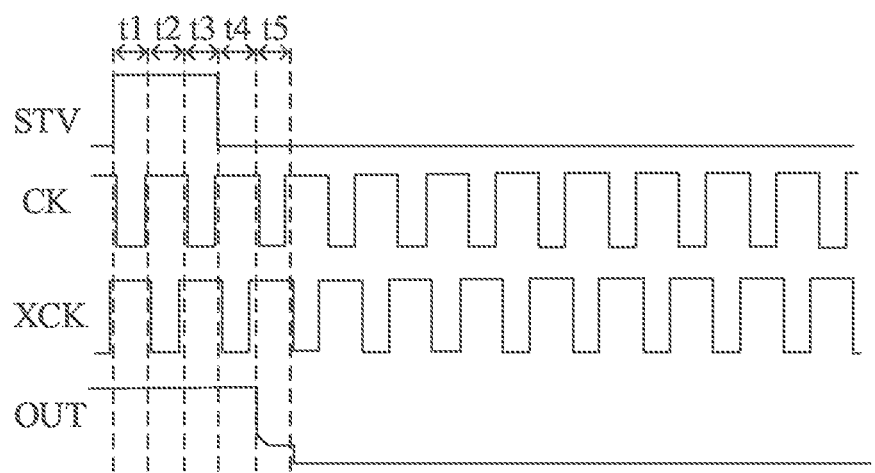
FIG. 11 is another timing diagram according to an embodiment of the present disclosure.

With reference to the timing diagram shown in FIG. 11, the working process of the drive circuit can include a first period t1, a second period t2, a third period t3, a fourth period t4, and a fifth period t5.

In the first period t1, the second control unit 5 transmits the ineffective voltage signal provided by the start signal line STV to the second node N2 in response to the effective voltage signal provided by the first clock signal line CK, and the first control unit 4 transmits the effective voltage signal provided by the first potential signal line VGL to the third node N3 in response to the effective voltage signal provided by the first clock signal line CK.

In the second period t2, the second control unit 5 transmits the ineffective voltage signal to the second node N2 in response to the effective voltage signal of the third node N3 and the effective voltage signal provided by the second clock signal line XCK, the third control unit 6 transmits the effective voltage signal provided by the second clock signal line XCK to the first node N1 in response to the effective voltage signal of the third node N3 and the effective voltage signal provided by the second clock signal line XCK, and the output module 3 transmits the ineffective voltage signal provided by the second potential signal line VGH to the output wire OUT in response to the effective voltage signal of the first node N1 and the ineffective voltage signal of the second node N2.

In the third period t3, the second control unit 5 transmits the ineffective voltage signal provided by the start signal line STV to the second node N2 in response to the effective voltage provided by the first clock signal line CK, the first control unit 4 transmits the effective voltage signal provided by the first potential signal line VGL to the third node N3 in response to the effective voltage signal provided by the first clock signal line CK, and the output module 3 continues outputting the ineffective voltage signal to the output wire OUT in response to the effective voltage signal of the first node N1 and the ineffective voltage signal of the second node N2. In this period, the pixel circuit does not drive the display element to emit light.

In the fourth period t4, the second control unit 5 transmits the ineffective voltage signal to the second node N2 in response to the effective voltage signal of the third node N3 and the effective voltage signal provided by the second clock signal line XCK, the third control unit 6 transmits the effective voltage signal provided by the second clock signal line XCK to the first node N1 in response to the effective voltage signal of the third node N3 and the effective voltage signal provided by the second clock signal line XCK, and the output module 3 continues outputting the ineffective voltage signal to the output wire OUT in response to the effective voltage signal of the first node N1 and the ineffective voltage signal of the second node N2. In this period, the pixel circuit does not drive the display element to emit light.

In the fifth period t5, the second control unit 5 transmits the effective voltage signal provided by the start signal line STV to the second node N2 in response to the effective voltage signal provided by the first clock signal line CK, the first control unit 4 transmits the effective voltage signal provided by the first clock signal line CK and the effective voltage signal provided by the first potential signal line VGL to the third node N3 in response to the effective voltage signal provided by the first clock signal line CK and the effective voltage signal of the second node N2, the third control unit 6 transmits the ineffective voltage signal provided by the second potential line VGH to the first node N1 in response to the effective voltage signal of the second node N2, and the output module 3 transmits the effective voltage signal provided by the first potential signal line VGL to the output wire OUT in response to the effective voltage signal of the second node N2 and the ineffective voltage signal of the first node N1. At this time, the pixel circuit drives the display element to emit light, and the drive circuit is in the display state.

The above working process is the working process of the drive circuit when the display panel enters displaying of each frame image. In other words, when the display panel performs displaying of each frame image, the working process of the drive circuit includes the above first period t1 to fifth period t5, and the fifth period t5 is the display state in the embodiment of the present disclosure.

Figure 12:
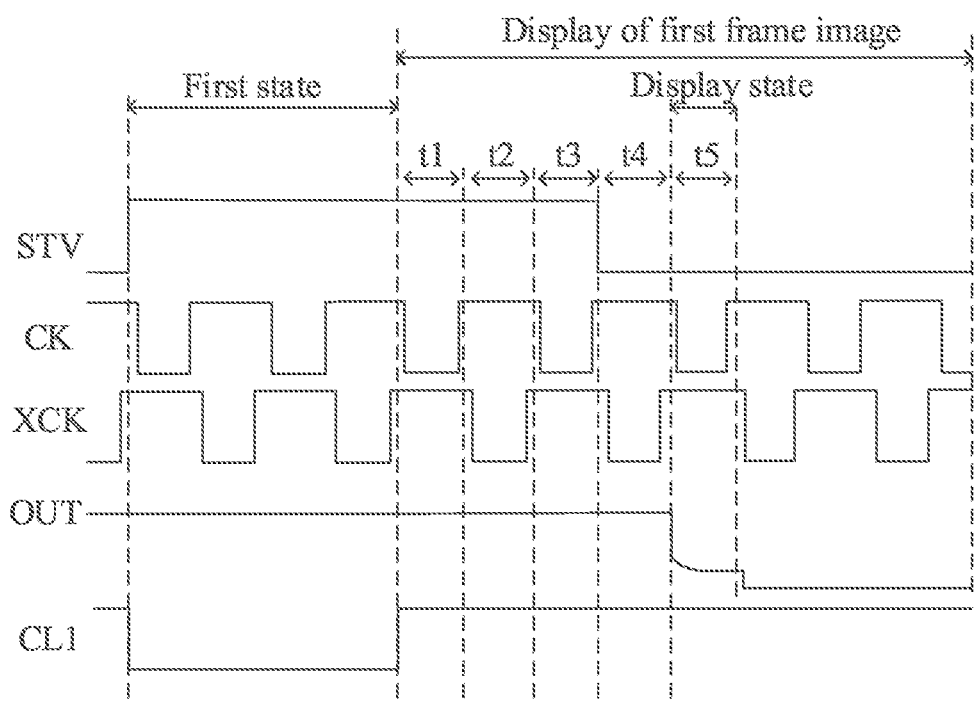
FIG. 12 is a timing diagram of a first control signal according to an embodiment of the present disclosure.
Figure 13:
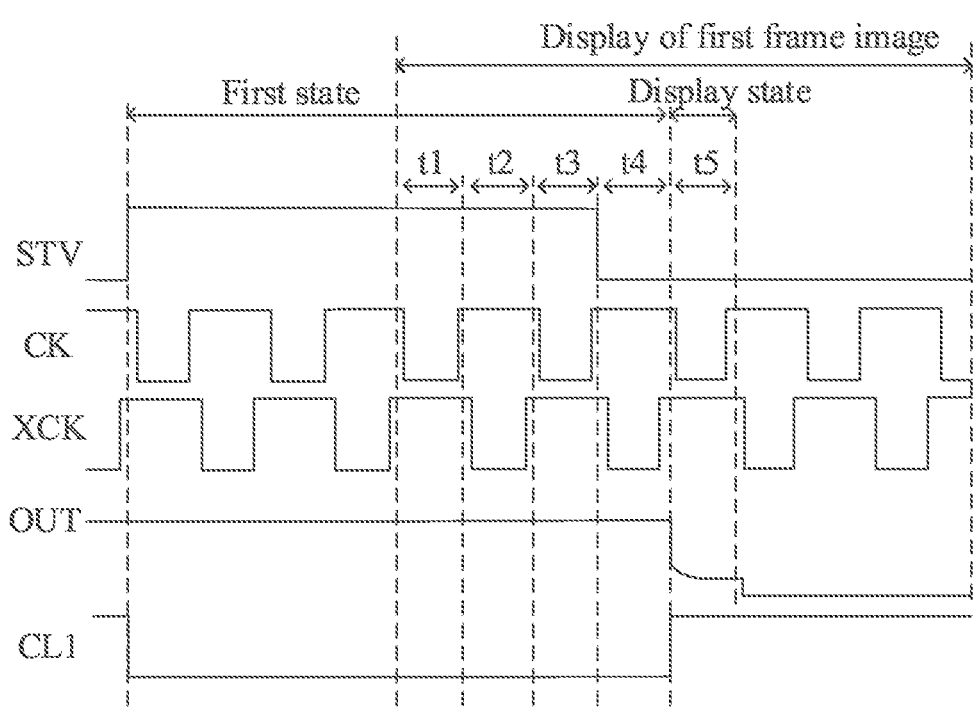
FIG. 13 is another timing diagram of the first control signal according to an embodiment of the present disclosure.

In an exemplary embodiment, the first transistor M1 is a P-type transistor, when the first state only includes the state in which the display device is powered on for starting up and does not start displaying images, the timing diagram of the first control signal can be that shown in FIG. 12. At this time, the control signal can be at the low voltage level only before the displaying of the first frame image, and can be continuously maintained at the high voltage level after the displaying of the first frame image starts. In an embodiment, when the first state includes a state where the display device is powered on for starting up and does not start displaying images and the state where the drive circuit transmits the ineffective voltage signal to the output wire OUT during displaying of each frame image, the timing diagram of the first control signal can be as shown in FIG. 13. At this time, the first control signal is at the low voltage level in the first period t1 to the fourth period t4 of the working process of the driving control circuit before the displaying of the first frame image and during the displaying of each frame image, and is at the high voltage level only in the fifth period t5. It should be noted that, in some optional embodiments, the first control signal can also be at the low voltage level in at least one of the first period t1 to the fourth period t4, and is at the high voltage level in the fifth period t5.

FIG. 14 is yet another schematic diagram of the drive circuit according to an embodiment of the present disclosure. In an embodiment, as shown in FIG. 14, the second control unit 5 includes a third transistor M3, a fourth transistor M4, and a fifth transistor M5.

A control electrode of the third transistor M3 is electrically connected to the first clock signal line CK, a first electrode of the third transistor M3 is electrically connected to the start signal line STV, and a second electrode of the third transistor M3 is electrically connected to the second node N2. A control electrode of the fourth transistor M4 is electrically connected to the third node N3, a first electrode of the fourth transistor M4 is electrically connected to the second potential signal line VGH, and a second electrode of the fourth transistor M4 is electrically connected to the fourth node N4. A control electrode of the fifth transistor M5 is electrically connected to the second clock signal line XCK, a first electrode of the fifth transistor M5 is electrically connected to the fourth node N4, and a second electrode of the fifth transistor M5 is electrically connected to the second node N2.

In an embodiment, in the first period t1 and the third period t3, the third transistor M3 is turned on under the low voltage level provided by the first clock signal line CK, and the third transistor M3 transmits the high voltage level provided by the start signal line STV to the second node N2. In the second period t2 and the fourth period t4, the fourth transistor M4 is turned on under the low voltage level of the third node N3, the fifth transistor M5 is turned on under the low voltage level provided by the second clock signal line XCK, and the high voltage level provided by the second potential signal line VGH is transmitted to the second node N2 through the turned-on fourth transistor M4 and fifth transistor M5. In the third period t3, the third transistor M3 is turned on under the low voltage level provided by the first clock signal line CK, and transmits the high voltage level provided by the start signal line STV to the second node N2. In the fifth period t5, the third transistor M3 is turned on under the low voltage level provided by the first clock signal line CK, and transmits the low voltage level provided by the start signal line STV to the second node N2.

In an embodiment, the protect module 2 is further configured to transmits the ineffective voltage signal to the fourth node N4 in response to a control signal in the first state. In the fourth state, the fifth transistor M5 transmits the ineffective voltage signal of the fourth node N4 to the second node N2 in response to the second clock signal, such that the output module 3 does not transmit the effective voltage signal to the output wire OUT, which improves the accuracy of the level state of the signal outputted by the output module 3 in the first state.

In an embodiment, referring to FIG. 14 again, the protect module 2 further includes a sixth transistor M6. A control electrode of the sixth transistor M6 is electrically connected to the third control signal line CK3, a first electrode of the sixth transistor M6 is electrically connected to the second potential signal line VGH, and a second electrode of the sixth transistor M6 is electrically connected to the fourth node N4.

In the first state, the sixth transistor M6 is turned on under the second control signal provided by the second control signal line CL3, and the high voltage level provided by the second potential signal line VGH is transmitted to the fourth node N4 through the turned-on sixth transistor M6. The fifth transistor M5 is turned on under the low voltage level provided by the second clock signal line XCK, and the high voltage level of the fourth node N4 is transmitted to the second node N2 through the turned-on fifth transistor M5, such that the output module 3 does not transit the effective voltage signal to the output wire OUT.

The second clock signal line XCK can provide a high voltage level and a low voltage level alternately. When the second clock signal line XCK provides the low voltage level, the high voltage level of the fourth node N4 can be transmitted to the second node N2 through the fifth transistor M5 that is turned on under the low voltage level provided by the second clock signal line XCK.

In an embodiment, when the first transistor M1 and the sixth transistor M6 are the same type of transistors, the first control signal line CL1 and the third control signal line CL3 can be reused as a same control signal line. In an embodiment, when the first transistor M1 and the sixth transistor M6 are different types of transistors, the first control signal line CL1 and the third control signal line CK3 are two separated control signal lines.

In an embodiment, referring to FIG. 14 again, the first control unit 4 includes a seventh transistor M7 and an eighth transistor M8.

A control electrode of the seventh transistor M7 is electrically connected to the first clock signal line CK, a first electrode of the seventh transistor M7 is electrically connected to the first potential signal line VGL, and a second electrode of the seventh transistor M7 is electrically connected to the third node N3. A control electrode of the eighth transistor M8 is electrically connected to the second node N2, a first electrode of the eighth transistor M8 is electrically connected to the first clock signal line CK, and a second electrode of the eighth transistor M8 is electrically connected to the third node N3.

In an embodiment, in the first period t1 and the third period t3, the seventh transistor M7 is turned on under the low voltage level provided by the first clock signal line CK, and the low voltage level provided by the first potential signal line VGL is transmitted to the third node N3 through the turned-on seventh transistor M7. In the fifth period t5, the seventh transistor M7 is turned on under the low voltage level provided by the first clock signal line CK, and the low voltage level provided by the first potential signal line VGL is transmitted to the third node N3 through the turned-on seventh transistor M7; the eighth transistor M8 is turned on under the low voltage level of the second node N2, and the low voltage level provided by the first clock signal line CK is transmitted to the third node N3 through the turned on eighth transistor M8.

In an embodiment, referring to FIG. 14 again, the third control unit 6 includes a ninth transistor M9, a tenth transistor M10, an eleventh transistor M11, and a first capacitor C1.

A control electrode of the ninth transistor M9 is electrically connected to the third node N3, and a first electrode of the ninth transistor M9 is electrically connected to the second clock signal line XCK. A control electrode of the tenth transistor M10 is electrically connected to the second clock signal line XCK, a first electrode of the tenth transistor M10 is electrically connected to a second electrode of the ninth transistor M9, and a second electrode of the tenth transistor M10 is electrically connected to the first node N1. A control electrode of the eleventh transistor M11 is electrically connected to the second node N2, a first electrode of the eleventh transistor M11 is electrically connected to the second potential signal line VGH, and a second electrode of the eleventh transistor M11 is electrically connected to the first node N1. A first plate of the first capacitor C1 is electrically connected to the third node N3, and a second plate of the first capacitor C1 is electrically connected to the second electrode of the ninth transistor M9.

In an embodiment, in the second period t2 and the fourth period t4, the ninth transistor M9 is turned on under the effective voltage signal of the third node N3, the tenth transistor M10 is turned on under the effective voltage signal provided by the second clock signal line XCK, the effective voltage signal provided by the second clock signal line XCK is transmitted to the first node N1 through the turned-on ninth transistor M9 and tenth transistor M10. In the fifth period t5, the eleventh transistor M11 is turned on under the effective voltage signal of the second node N2, and the eleventh transistor M11 transmits the ineffective voltage signal provided by the second potential signal line VGH to the first node N1.

In an embodiment, referring to FIG. 14 again, the drive circuit further includes a second capacitor C2 and a third capacitor C3. A first plate of the second capacitor C2 is electrically connected to the second potential signal line VGH, and a second plate of the second capacitor C2 is electrically connected to the first node N1. The second capacitor C2 is configured to improve the level stability of the first node N1. A first plate of the third capacitor C3 is electrically connected to the second node N2, and the second plate of the third capacitor C3 is electrically connected to the second clock signal line XCK. The third capacitor C3 is configured to improve the level stability of the second node N2.

In an embodiment, referring to FIG. 14 again, the output module 3 includes a twelfth transistor M12 and a thirteenth transistor M13.

A control electrode of the twelfth transistor M12 is electrically connected to the first node N1, a first electrode of the twelfth transistor M12 is electrically connected to the second potential signal line VGH, and a second electrode of the twelfth transistor M12 is electrically connected to the output wire OUT. A control electrode of the thirteenth transistor M13 is electrically connected to the second node N2, a first electrode of the thirteenth transistor M13 is electrically connected to the first potential signal line VGL, and a second electrode of the thirteenth transistor M13 is electrically connected to the output wire OUT.

In an embodiment, when the effective voltage signal is supplied to the first node N1, the twelfth transistor M12 is turned on under the effective voltage signal of the first node N1, and the ineffective voltage signal provided by the second potential signal line VGH is transmitted to the output wire OUT through the turned-on twelfth transistor M12. When the effective voltage signal is supplied to the second node N2, the thirteenth transistor M13 is turned on under the effective voltage signal of the second node N2, and the effective voltage signal provided by the first potential signal line VGL is transmitted to the output wire OUT through the turned-on thirteenth transistor M13.

In an embodiment, the drive circuit can be an emission drive circuit of the OLED display panel, the output wire OUT can be a light-emitting control signal line, and the output wire OUT is configured to transmit a light-emitting drive signal to the pixel circuit. In the first state, the emission drive circuit outputs the ineffective light-emitting drive signal at the low voltage level to the output wire OUT, and thus the pixel circuit cannot transmit the drive current to the organic light emitting diode under the action of the ineffective emission drive signal, causing the organic light emitting diode not to emit light.

In another embodiment, the drive circuit can be the scan drive circuit in the OLED display panel, the LCD display panel, or the electronic paper display panel, the output wire OUT is the scan signal line, and the output wire OUT is configured to transmit the scan drive signal to the pixel circuit. In the first state, the scan drive circuit outputs the ineffective scan drive signal at the low voltage level to the output wire OUT, and thus the pixel circuit cannot drive the display element to emit light under the action of the ineffective scan drive signal.

Figure 6:
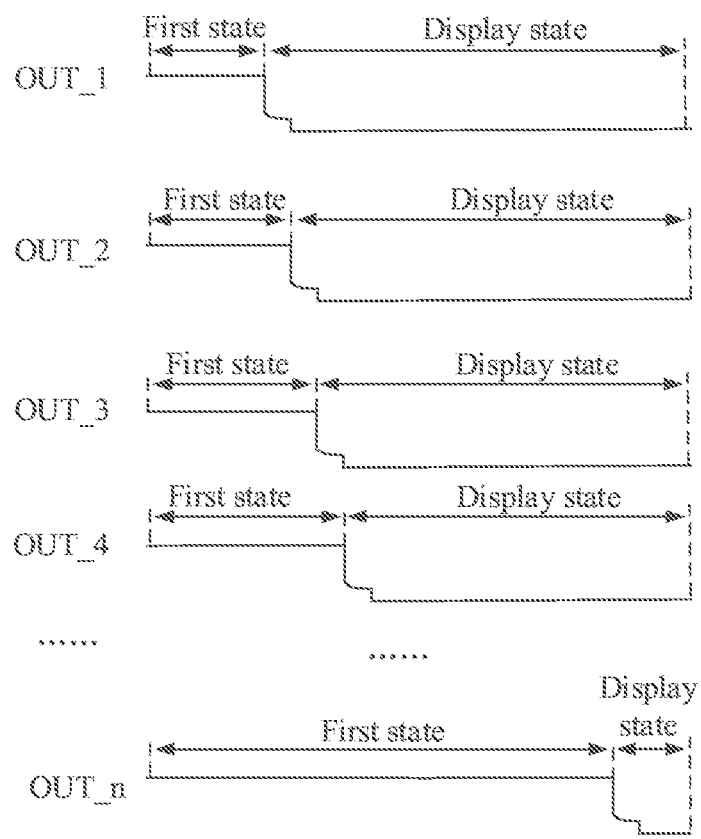
FIG. 6 is a timing diagram according to an embodiment of the present disclosure.

An embodiment of the present disclosure also provides a drive method of the drive circuit. With reference to FIG. 5 and FIG. 6, as shown in FIG. 15, FIG. 15 is a flowchart of a drive method according to an embodiment of the present disclosure. The drive method includes the step K1 and step K2.

At step K1, in the first state, the protect module 2 transmits an effective voltage signal to the first node N1 in response to a control signal, and the output module 3 transmits an ineffective voltage signal to the output wire OUT in response to the effective voltage signal of the first node N1.

At step K2, in the display state, the control module 1 transmits voltage signals to the first node N1 and the second node N2 in response to a first clock signal and a second clock signal, and the output module 3 transmits the effective voltage signal to the output wire OUT in response to the control signals of the first node N1 and the second node N2.

In the embodiment of the present disclosure, when the display device is powered on for starting up and before the first frame image is displayed, the drive circuit is in the first state. In the first state, the protect module 2 tssransmits an effective voltage signal to the first node N1 in response to the control signal such that the output module 3 transmits the ineffective voltage signal to the output wire OUT in response to the effective voltage signal of the first node N1. The ineffective voltage signal is further transmitted to the pixel circuit through the output wire OUT such that the pixel circuit cannot transmit the drive signal to the display element, thereby ensuring that the display element does not emit light in the first state, thereby effectively avoiding the flickering of the display device during starting up and improving the working reliability and display effect of the display device.

FIG. 16 is another flowchart of the drive method according to an embodiment of the present disclosure. In an embodiment, as shown in FIG. 16, step K1 further includes: in the first state, transmitting, by the protect module 2, the ineffective voltage signal to the second node N2 in response to a control signal. In this case, the output module 3 does not transmit the effective voltage signal to the output wire OUT, which improves the accuracy of the level state of the signal outputted by the output module 3 in the first state.

FIG. 17 is yet another flowchart of the drive method according to an embodiment of the present disclosure. In an embodiment, as shown in FIG. 17, step K2 further includes: in the display state, the protect module 2 stopping transmitting the voltage signal to the first node N1 in response to a control signal. Therefore, it is ensured that the first node N1 can normally receive the ineffective voltage signal in the display state, and the accuracy of the voltage level state of the signal outputted by the output module 3 is ensured.

In an embodiment, with reference to FIG. 5 and FIG. 6, the control module 1 includes the first control unit 4, the second control unit 5, and the third control unit 6. The first control unit 4 is electrically connected to the first clock signal line CK, the first potential signal line VGL, the second node N2 and the third node N3. The second control unit 5 is electrically connected to the start signal line STV, the first clock signal line CK, the second clock signal line XCK, the second potential signal line VGH, the third node N3 and the second node N2. The third control unit 6 is electrically connected to the second clock signal line XCK, the first node N1, the second node N2 and the third node N3.

The working process of the drive circuit includes: the first period t1, the second period t2, the third period t3, the fourth period t4, and the fifth period t5.

FIG. 18 is yet another flowchart of the drive method according to an embodiment of the present disclosure. As shown in FIG. 18, the working process of the drive circuit includes steps H1, H2, H3, H4, and H5.

At step H1, in the first period t1, the second control unit 5 transmits the ineffective voltage signal provided by the start signal line STV to the second node N2 in response to the effective voltage signal provided by the first clock signal line CK, and the first control unit 4 transmits the effective voltage signal provided by the first potential signal line VGL to the third node N3 in response to the effective voltage signal provided by the first clock signal line CK.

At step H2, in the second period t2, the second control unit 5 transmits the ineffective voltage signal to the second node N2 in response to the effective voltage signal of the third node N3 and the effective voltage signal provided by the second clock signal line XCK, the third control unit 6 transmits the effective voltage signal provided by the second clock signal line XCK to the first node N1 in response to the effective voltage signal of the third node N3 and the effective voltage signal provided by the second clock signal line XCK, and the output module 3 transmits the ineffective voltage signal provided by the second potential signal line VGH to the output wire OUT in response to the effective voltage signal of the first node N1 and the ineffective voltage signal of the second node N2.

At step H3, in the third period t3, the second control unit 5 transmits the ineffective voltage signal provided by the start signal line STV to the second node N2 in response to the effective voltage provided by the first clock signal line CK, the first control unit 4 transmits the effective voltage signal provided by the first potential signal line VGL to the third node N3 in response to the effective voltage signal provided by the first clock signal line CK, and the output module 3 continues outputting the ineffective voltage signal to the output wire OUT in response to the effective voltage signal of the first node N1 and the ineffective voltage signal of the second node N2.

At step H4, in the fourth period t4, the second control unit 5 transmits the ineffective voltage signal to the second node N2 in response to the effective voltage signal of the third node N3 and the effective voltage signal provided by the second clock signal line XCK, the third control unit 6 transmits the effective voltage signal provided by the second clock signal line XCK to the first node N1 in response to the effective voltage signal of the third node N3 and the effective voltage signal provided by the second clock signal line XCK, and the output module 3 continues outputting the ineffective voltage signal to the output wire OUT in response to the effective voltage signal of the first node N1 and the ineffective voltage signal of the second node N2.

At step H5, in the fifth period t5, the second control unit 5 transmits the effective voltage signal provided by the start signal line STV to the second node N2 in response to the effective voltage signal provided by the first clock signal line CK, the first control unit 4 transmits the effective voltage signal provided by the first clock signal line CK and the effective voltage signal provided by the first potential signal line STV to the third node N3 in response to the effective voltage signal provided by the first clock signal line CK and the effective voltage signal of the second node N2, the third control unit 6 transmits the ineffective voltage signal provided by the second potential line VGH to the first node N1 in response to the effective voltage signal of the second node N2, and the output module 3 transmits the effective voltage signal provided by the first potential signal line VGL to the output wire OUT in response to the effective voltage signal of the second node N2 and the ineffective voltage signal of the first node N1.

In an embodiment, with reference to FIG. 14, the second control unit 5 includes a third transistor M3, a fourth transistor M4, and a fifth transistor M5. A control electrode of the third transistor M3 is electrically connected to the first clock signal line CK, a first electrode of the third transistor M3 is electrically connected to the start signal line STV, and a second electrode of the third transistor is electrically connected to the second node N2. A control electrode of the fourth transistor M4 is electrically connected to the third node N3, a first electrode of the fourth transistor M4 is electrically connected to the second potential signal line VGH, and a second electrode of the fourth transistor M4 is electrically connected to the fourth node N4. A control electrode of the fifth transistor M5 is electrically connected to the second clock signal line XCK, a first electrode of the fifth transistor M5 is electrically connected to the fourth node N4, and a second electrode of the fifth transistor M5 is electrically connected to the second node N2.

Based on the above configuration, the protect module 2 can further include a sixth transistor M6. A control electrode of the sixth transistor M6 is electrically connected to a control signal line, a first electrode of the sixth transistor M6 is electrically connected to the second potential signal line VGH, and a second electrode of the sixth transistor M6 is electrically connected to a fourth node N4.

FIG. 19 is yet another flowchart of the drive method according to an embodiment of the present disclosure. As shown in FIG. 19, in the first state, the sixth transistor M6 transmits the ineffective voltage signal to the fourth node N4 in response to a control signal, and the fifth transistor M5 transmits ineffective voltage signal of the fourth node N4 to the second node N2 in response to the second clock signal.

In an embodiment, in the first state, the sixth transistor M6 is turned on under the third control signal provided by the third control signal line CL3, the high voltage level provided by the second potential signal line VGH is transmitted to the fourth node N4 through the turned-on sixth transistor M6; the fifth transistor M5 is turned on under the low voltage level provided by the second clock signal line XCK, and the high voltage level of the fourth node N4 is transmitted to second node N2 through the turned-on fifth transistor M5, such that the output module 3 does not transit the effective voltage signal to the output wire OUT, which further improves the accuracy of the level state of the signal outputted by the output module 3 in the first state.

Referring to FIG. 2 again, an embodiment of the present disclosure provides a shift register 103. The shift register 103 includes a plurality of cascaded drive circuits 101 described above. The specific structure and drive method for the drive circuits 101 have been described in detail in the above embodiments, and will not be repeated herein.

Figure 20:
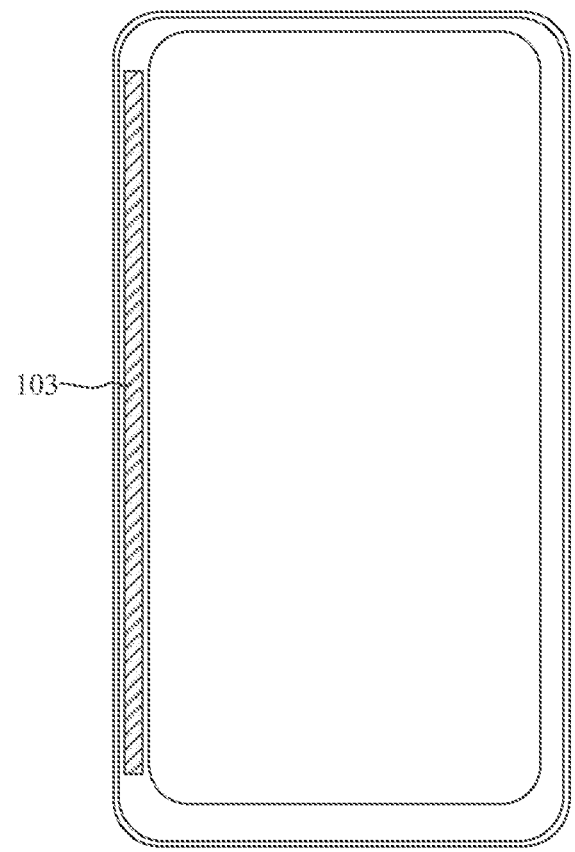
FIG. 20 is a schematic diagram of a display device according to an embodiment of the present disclosure.

An embodiment of the present disclosure provides a display device. FIG. 20 is a schematic diagram of a display device according to an embodiment of the present disclosure. As shown in FIG. 20, the display device includes the above shift register 103. Of course, the display device shown in FIG. 20 is only illustrative, and the display device can be any electronic device having a display function, such as a mobile phone, a tablet computer, a notebook computer, an electronic paper book, or a television.

The above are merely some embodiments of the present disclosure, and are not intended to limit the present disclosure. Any modifications, equivalent replacements or improvements made within the principles of the present disclosure shall be included in the protection scope of the present disclosure.

It should be noted that the above embodiments are only used to illustrate, but not to limit the technical solutions of the present disclosure. Although the present application is described in detail with reference to the foregoing embodiments, those skilled in the art shall understand that they can modify the technical solutions described in the foregoing embodiments, or equivalently replace some or all of the technical features. These modifications or replacements shall not direct the essence of the corresponding technical solutions away from the scope of the technical solutions of the embodiments of the present disclosure.

What is claimed is:

1. A drive circuit, comprising:
    a control module electrically connected to a start signal line, a first clock signal line, a second clock signal line, a first potential signal line, a second potential signal line, a first node, and a second node, wherein the drive circuit has a first state and a display state, wherein the first state is prior to the display state, and the control module is configured to transmit a voltage signal to the first node and the second node in response to a first clock signal and a second clock signal;
    an output module electrically connected to the first potential signal line, the second potential signal line, an output wire, the first node, and the second node, wherein the output module is configured to transmit a voltage signal to the output wire in response to a control signal of the first node and a control signal of the second node; and
    a protect module, wherein in the first state, the protect module is configured to transmit an effective voltage signal to the first node in response to a control signal in such a manner that the output module transmits an ineffective voltage signal to the output wire,
    wherein the control module comprises:
    a third control unit electrically connected to the second clock signal line, the first node, the second node, and a third node, and configured to transmit a voltage signal to the first node in response to a voltage signal of the third node, the second clock signal, and the voltage signal of the second node; and
    wherein the third control unit comprises:
    a ninth transistor comprising a control electrode electrically connected to the third node, a first electrode electrically connected to the second clock signal line, and a second electrode;
    a tenth transistor comprising a control electrode electrically connected to the second clock signal line, a first electrode electrically connected to the second electrode of the ninth transistor, and a second electrode electrically connected to the first node;
    an eleventh transistor comprising a control electrode electrically connected to the second node, a first electrode electrically connected to the second potential signal line, and a second electrode electrically connected to the first node; and a first capacitor comprising a first plate electrically connected to the third node, and a second plate electrically connected to the second electrode of the ninth transistor.

2. The drive circuit according to claim 1, wherein the protect module comprises a first transistor, wherein the first transistor comprises a control electrode electrically connected to a first control signal line, a first electrode electrically connected to a first signal line, and a second electrode electrically connected to the first node.

3. The drive circuit according to claim 1, wherein in the first state, the protect module is further configured to transmit an ineffective voltage signal to the second node in response to a control signal in such a manner that the output module does not transmit an effective voltage signal to the output wire.

4. The drive circuit according to claim 3, wherein the protect module further comprises a second transistor, wherein the second transistor comprises a control electrode electrically connected to a second control signal line, a first electrode electrically connected to a second signal line, and a second electrode electrically connected to the second node.

5. The drive circuit according to claim 4, wherein the protect module comprises a first transistor, wherein the first transistor comprises a control electrode electrically connected to a first control signal line, a first electrode electrically connected to a first signal line, and a second electrode electrically connected to the first node; and
wherein the control electrode of the first transistor is electrically connected to the control electrode of the second transistor, the first signal line is the first potential signal line, and the second signal line is the second potential signal line; or
the first transistor and the second transistor are both P type transistors, the first electrode of the first transistor is electrically connected to the control electrode of the first transistor, and the second signal line is the second potential signal line; or
the first transistor and the second transistor are both N type transistors, the first electrode of the second transistor is electrically connected to the control electrode of the second transistor, and the first signal line is the first potential signal line.

6. The drive circuit according to claim 1, wherein the control module comprises:
a first control unit electrically connected to the first clock signal line, the first potential signal line, the second node, and the third node, and configured to transmit a voltage signal to the third node in response to a first clock signal and the voltage signal of the second node; and
a second control unit electrically connected to the start signal line, the first clock signal line, the second clock signal line, the second potential signal line, the third node, and the second node, and configured to transmit a voltage signal to the second node in response to the first clock signal, the second clock signal, and the voltage signal of the third node.

7. The drive circuit according to claim 6, wherein the second control unit comprises:
a third transistor comprising a control electrode electrically connected to the first clock signal line, a first electrode electrically connected to the start signal line, and a second electrode electrically connected to the second node;
a fourth transistor comprising a control electrode electrically connected to the third node, a first electrode electrically connected to the second potential signal line, and a second electrode electrically connected to a fourth node; and
a fifth transistor comprising a control electrode electrically connected to the second clock signal line, a first electrode electrically connected to the fourth node, and a second electrode electrically connected to the second node.

8. The drive circuit according to claim 7, wherein in the first state, the protect module is further configured to transmit an ineffective voltage signal to the fourth node in response to a control signal, and
in the first state, the fifth transistor transmits the ineffective voltage signal of the fourth node to the second node in response to the second clock signal in such a manner that the output module does not transmit an effective voltage signal to the output wire.

9. The drive circuit according to claim 8, wherein the protect module further comprises a sixth transistor, wherein the sixth transistor comprises a control electrode electrically connected to a third control signal line, a first electrode electrically connected to the second potential signal line, and a second electrode electrically connected to the fourth node.

10. The drive circuit according to claim 6, wherein the first control unit comprises:
a seventh transistor comprising a control electrode electrically connected to the first clock signal line, a first electrode electrically connected to the first potential signal line, and a second electrode electrically connected to the third node; and
an eighth transistor comprising a control electrode electrically connected to the second node, a first electrode electrically connected to the first clock signal line, and a second electrode electrically connected to the third node.

11. The drive circuit according to claim 1, further comprising:
a second capacitor comprising a first plate electrically connected to the second potential signal line, and a second plate electrically connected to the first node; and
a third capacitor comprising a first plate electrically connected to the second node, and a second plate electrically connected to the second clock signal line.

12. The drive circuit according to claim 1, wherein the output module comprises:
a twelfth transistor comprising a control electrode electrically connected to the first node, a first electrode electrically connected to the second potential signal line, and a second electrode electrically connected to the output wire; and
a thirteenth transistor comprising a control electrode electrically connected to the second node, a first electrode electrically connected to the first potential signal line, and a second electrode electrically connected to the output wire.

13. The drive circuit according to claim 1, wherein the drive circuit is an emission drive circuit, and the output wire is a light-emitting control signal line.

14. The drive circuit according to claim 1, wherein the drive circuit is a scan drive circuit, and the output wire is a scan signal line.

15. A drive method for a drive circuit, comprising:
in a first state of the drive circuit, transmitting, by a protect module, an effective voltage signal to a first node in response to a control signal, and transmitting, by an output module, an ineffective voltage signal to an output wire in response to an effective voltage signal of the first node; and in a display state of the drive circuit, transmitting, by a control module, a voltage signal to the first node and a voltage to a second node in response to a first clock signal and a second clock signal, and transmitting, by the output module, an effective voltage signal to the output wire in response to a control signal of the first node and a control signal of the second node, wherein the drive circuit comprises:

the control module electrically connected to a start signal line, a first clock signal line, a second clock signal line, a first potential signal line, a second potential signal line, the first node, and the second node, wherein the drive circuit has the first state and the display state;

the output module electrically connected to the first potential signal line, the second potential signal line, the output wire, the first node, and the second node; and the protect module;

wherein the control module comprises:

a third control unit electrically connected to the second clock signal line, the first node, the second node, and a third node, and configured to transmit a voltage signal to the first node in response to a voltage signal of the third node, the second clock signal, and the voltage signal of the second node; and wherein the third control unit comprises:

a ninth transistor comprising a control electrode electrically connected to the third node, a first electrode electrically connected to the second clock signal line, and a second electrode;

a tenth transistor comprising a control electrode electrically connected to the second clock signal line, a first electrode electrically connected to the second electrode of the ninth transistor, and a second electrode electrically connected to the first node;

an eleventh transistor comprising a control electrode electrically connected to the second node, a first electrode electrically connected to the second potential signal line, and a second electrode electrically connected to the first node; and a first capacitor comprising a first plate electrically connected to the third node, and a second plate electrically connected to the second electrode of the ninth transistor.

16. The drive method according to claim 15, wherein in the first state, the protect module further transmits an ineffective voltage signal to the second node in response to a control signal.

17. The drive method according to claim 15, wherein in the display state, the protect module stops transmitting a voltage signal to the first node in response to a control signal.

18. The drive method according to claim 15, wherein the control module comprises a first control unit, a second control unit, and a third control unit, wherein the first control unit is electrically connected to the first clock signal line, the first potential signal line, the second node, and a third node; the second control unit is electrically connected to the start signal line, the first clock signal line, the second clock signal line, the second potential line, the third node, and the second node, and the third control unit is electrically connected to the second clock signal line, the first node, the second node, and the third node;

the drive circuit has a working process comprising a first period, a second period, a third period, a fourth period, and a fifth period;

in the first period, the second control unit transmits an ineffective voltage signal provided by the start signal line to the second node in response to an effective voltage signal provided by the first clock signal line, and the first control unit transmits an effective voltage signal provided by the first potential signal line to the third node in response to the effective voltage signal provided by the first clock signal line;

in the second period, the second control unit transmits an ineffective voltage signal to the second node in response to an effective voltage signal of the third node and an effective voltage signal provided by the second clock signal line, the third control unit transmits the effective voltage signal provided by the second clock signal line to the first node in response to the effective voltage signal of the third node and the effective voltage signal provided by the second clock signal line, and the output module transmits an ineffective voltage signal provided by the second potential signal line to the output wire in response to an effective voltage signal of the first node and an ineffective voltage signal of the second node;

in the third period, the second control unit transmits the ineffective voltage signal provided by the start signal line to the second node in response to the effective voltage provided by the first clock signal line, the first control unit transmits the effective voltage signal provided by the first potential signal line to the third node in response to the effective voltage signal provided by the first clock signal line, and the output module continues outputting an ineffective voltage signal to the output wire in response to the effective voltage signal of the first node and the ineffective voltage signal of the second node;

in the fourth period, the second control unit transmits an ineffective voltage signal to the second node in response to the effective voltage signal of the third node and the effective voltage signal provided by the second clock signal line, the third control unit transmits the effective voltage signal provided by the second clock signal line to the first node in response to the effective voltage signal of the third node and the effective voltage signal provided by the second clock signal line, and the output module continues outputting an ineffective voltage signal to the output wire in response to the effective voltage signal of the first node and the ineffective voltage signal of the second node; and in the fifth period, the second control unit transmits an effective voltage signal provided by the start signal line to the second node in response to the effective voltage signal provided by the first clock signal line, the first control unit transmits the effective voltage signal provided by the first clock signal line and the effective voltage signal provided by the first potential signal line to the third node in response to the effective voltage signal provided by the first clock signal line and the effective voltage signal of the second node, the third control unit transmits an ineffective voltage signal provided by the second potential line to the first node in response to the effective voltage signal of the second node, and the output module transmits the effective voltage signal provided by the first potential signal line to the output wire in response to the effective voltage signal of the second node and an ineffective voltage signal of the first node.

19. The drive method according to claim 18, wherein the second control unit comprises:

a third transistor comprising a control electrode electrically connected to the first clock signal line, a first electrode electrically connected to the start signal line, and a second electrode electrically connected to the second node;

a fourth transistor comprising a control electrode electrically connected to the third node, a first electrode electrically connected to the second potential signal line, and a second electrode electrically connected to a fourth node; and a fifth transistor comprising a control electrode electrically connected to the second clock signal line, a first electrode electrically connected to the fourth node, and a second electrode electrically connected to the second node;

wherein the protect module further comprises a sixth transistor, wherein the sixth transistor comprises a control electrode electrically connected to a third control signal line, a first electrode electrically connected to the second potential signal line, and a second electrode electrically connected to the fourth node; and wherein in the first state, the sixth transistor transmits an ineffective voltage signal to the fourth node in response to a control signal, and the fifth transistor transmits an ineffective voltage signal of the fourth node to the second node in response to the second clock signal.

20. A shift register, comprising drive circuits that are cascaded, wherein each of the drive circuits comprises:

a control module electrically connected to a start signal line, a first clock signal line, a second clock signal line, a first potential signal line, a second potential signal line, a first node, and a second node, wherein the drive circuit has a first state and a display state, wherein the first state is prior to the display state, and the control module is configured to transmit a voltage signal to the first node and the second node in response to a first clock signal and a second clock signal;

an output module electrically connected to the first potential signal line, the second potential signal line, an output wire, the first node, and the second node, wherein the output module is configured to transmit a voltage signal to the output wire in response to a control signal of the first node and a control signal of the second node; and a protect module, wherein in the first state, the protect module is configured to transmit an effective voltage signal to the first node in response to a control signal in such a manner that the output module transmits an ineffective voltage signal to the output wire;

wherein the control module comprises:

a third control unit electrically connected to the second clock signal line, the first node, the second node, and a third node, and configured to transmit a voltage signal to the first node in response to a voltage signal of the third node, the second clock signal, and the voltage signal of the second node; and wherein the third control unit comprises:

a ninth transistor comprising a control electrode electrically connected to the third node, a first electrode electrically connected to the second clock signal line, and a second electrode;

a tenth transistor comprising a control electrode electrically connected to the second clock signal line, a first electrode electrically connected to the second electrode of the ninth transistor, and a second electrode electrically connected to the first node;

an eleventh transistor comprising a control electrode electrically connected to the second node, a first electrode electrically connected to the second potential signal line, and a second electrode electrically connected to the first node; and a first capacitor comprising a first plate electrically connected to the third node, and a second plate electrically connected to the second electrode of the ninth transistor.

21. A display device, comprising the shift register according to claim 20.

* * * * *